United States Patent
Gernhardt et al.

(10) Patent No.: US 6,946,735 B2
(45) Date of Patent: Sep. 20, 2005

(54) SIDE-WALL BARRIER STRUCTURE AND METHOD OF FABRICATION

(75) Inventors: Stefan Gernhardt, Kanagawa-ken (JP); Jenny Lian, Tokyo-to (JP); Andreas Hilliger, Kanagawa-ken (JP); Rainer Bruchhaus, Kanagawa-ken (JP); Uwe Wellhausen, Kanagawa-ken (JP); Nicolas Nagel, Kanagawa-ken (JP)

(73) Assignee: Infineon AG (DE)

( * ) Notice: Subject to any disclaimer, the term of this patent is extended or adjusted under 35 U.S.C. 154(b) by 224 days.

(21) Appl. No.: 10/307,257

(22) Filed: Nov. 29, 2002

(65) Prior Publication Data

US 2004/0104471 A1 Jun. 3, 2004

(51) Int. Cl.[7] ............................................... H01L 23/48
(52) U.S. Cl. ....................... 257/741; 257/774; 438/629; 438/630
(58) Field of Search ................................ 257/762, 763, 257/764, 765, 757, 306, 310, 774, 755, 741; 438/3, 240, 253, 634, 686, 785, 629, 630

(56) References Cited

U.S. PATENT DOCUMENTS 5,459,345 A * 10/1995 Okudaira et al. ........... 257/310
6,278,150 B1 * 8/2001 Okudaira et al. ........... 257/306
6,696,761 B2 * 2/2004 Chan et al. ................. 257/762
6,764,863 B2 * 7/2004 Sheu et al. ..................... 438/3

* cited by examiner

Primary Examiner—Roy Potter
(74) Attorney, Agent, or Firm—Fish & Richardson P.C.

(57) ABSTRACT

The invention includes a wafer having a poly silicon plug passing through a CP-contact. The poly silicon plug is formed from a relatively heavily doped poly silicon layer and a relatively lightly doped poly silicon layer. The relatively lightly doped poly silicon layer passes through the relatively heavily doped poly silicon layer to extend beyond the relatively heavily doped poly silicon layer towards the surface of the wafer. A barrier layer covers top and side walls of the relatively lightly doped poly silicon layer for reducing oxidation at the surface of the poly silicon plug. The wafer is fabricated by depositing a relatively heavily doped poly silicon layer in a CP-contact, depositing a relatively lightly doped poly silicon layer to pass through the relatively heavily doped poly silicon layer, and depositing a barrier layer to cover top and side walls of the relatively lightly doped poly silicon layer to reduce oxidation at the surface of the poly silicon plug.

15 Claims, 8 Drawing Sheets

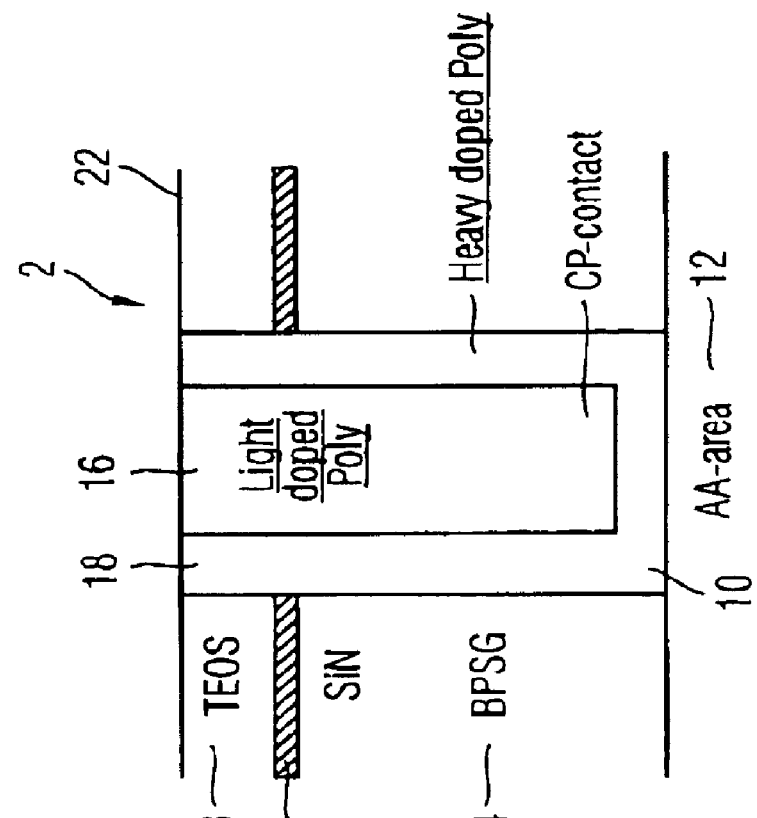
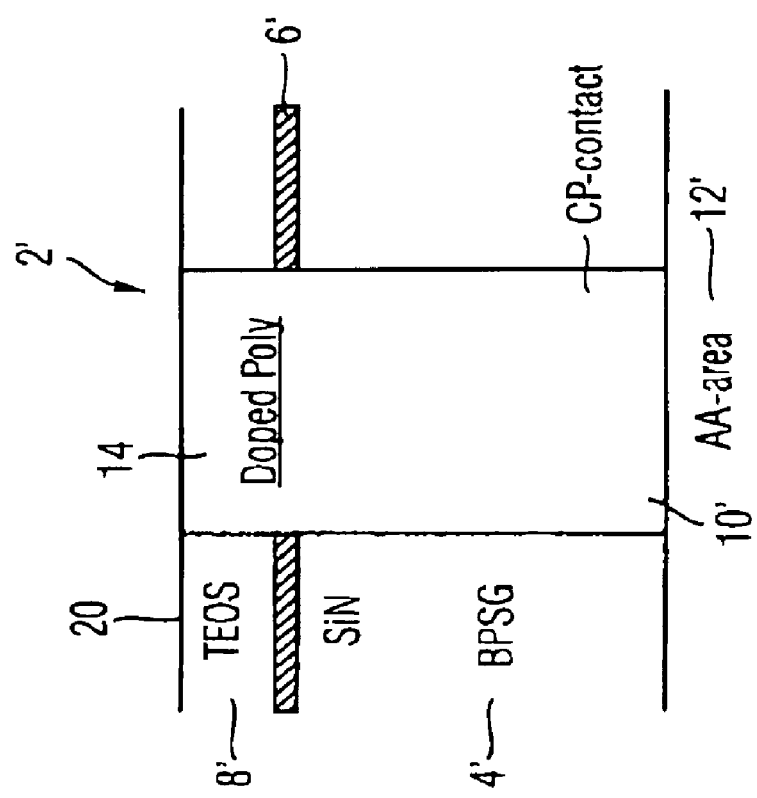

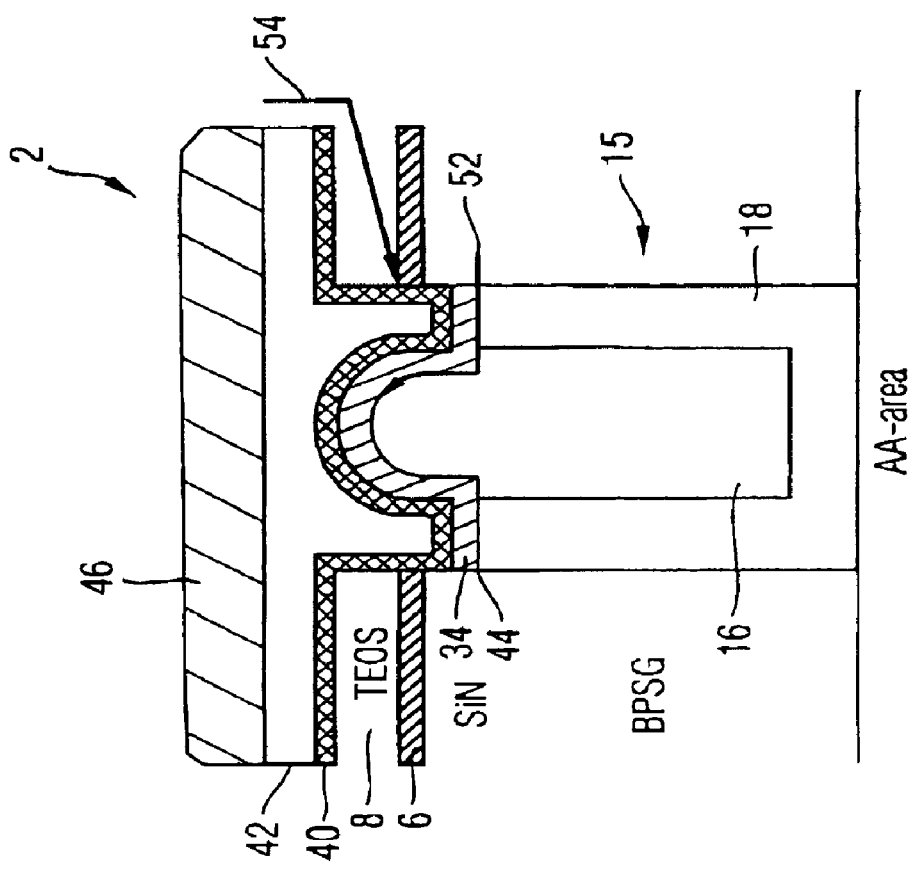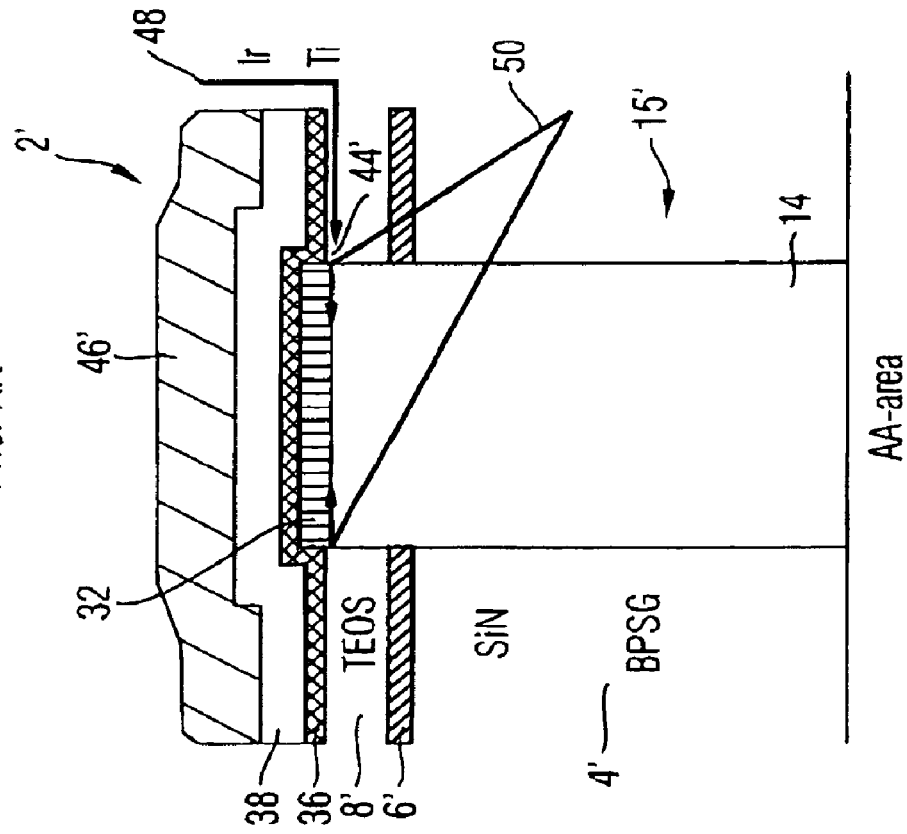

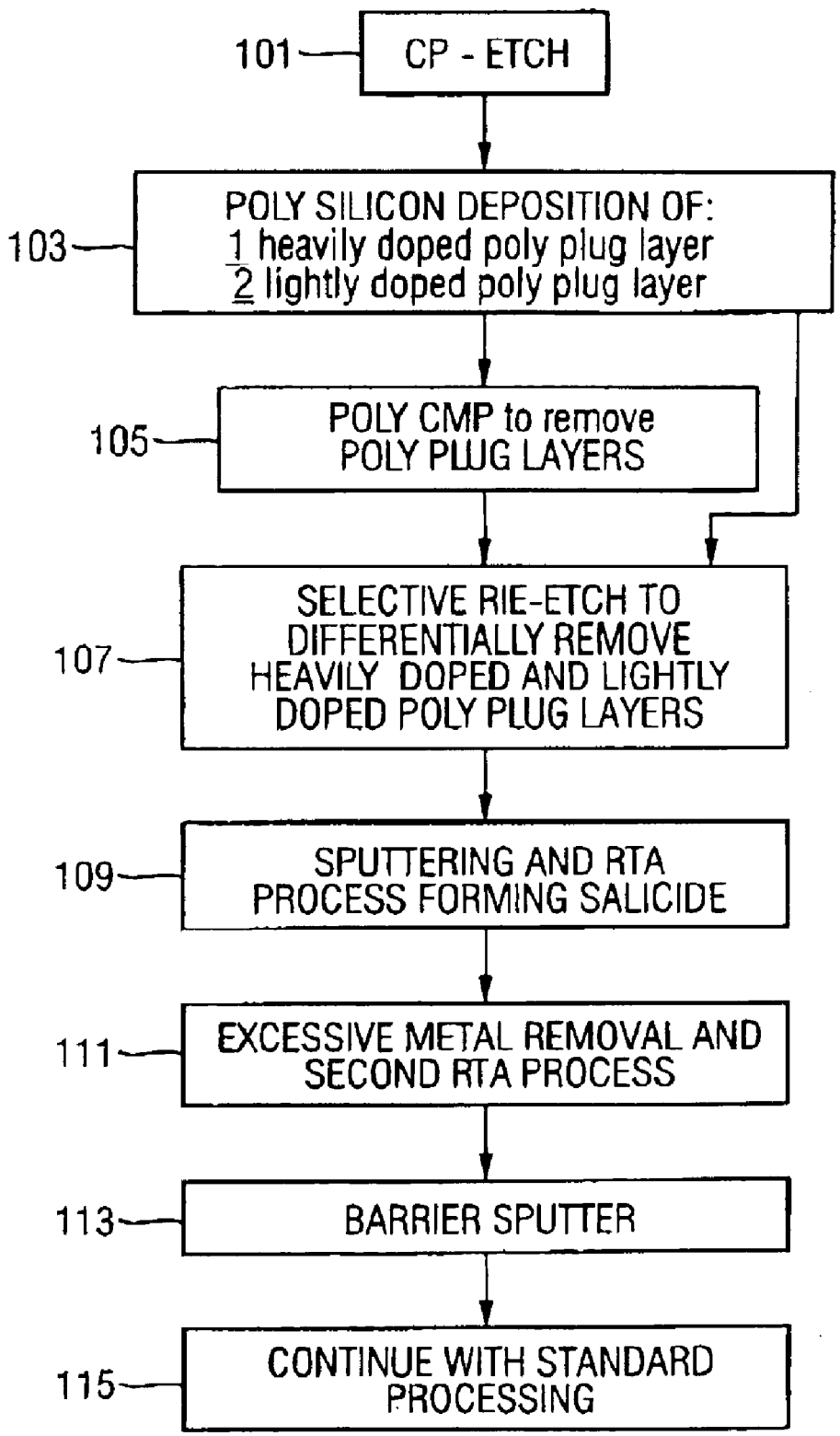

SIDE-WALL BARRIER STRUCTURE AND METHOD OF FABRICATION

FIELD OF THE INVENTION

The present invention relates to a barrier layer for preventing the diffusion of silicon into an electrode and oxygen into a contact plug.

BACKGROUND OF THE INVENTION

The ferroelectric materials in FeRAM and high K materials in DRAM generally are crystallized at a high temperature (600° C. or above) in oxygen ambient. A barrier is needed to prevent the diffusion of silicon from a contact plug to a capacitor and also to prevent the diffusion of oxygen from a capacitor to the contact plug. In prior-art wafers, poly silicon plugs are often used as vertical interconnects between metal lines in multilevel interconnect schemes. Often, in the prior-art, a barrier layer is formed at the top surface of the poly silicon plug which still leaves diffusion paths at the edge of the plug. The diffusion path for silicon is due to a discontinuous metal layer above, caused by the step height after the barrier formation. The diffusion path for oxygen is at the interface of salicide and poly silicon. To prevent these diffusion paths at the edge of the plug, it would be desirable to form an extended silicon barrier layer not only on the top surface, but also around the side wall of the plug contact and therefore recess the poly silicon.

SUMMARY OF THE INVENTION

The present invention provides an extended silicon barrier layer around both the top surface and side wall of a poly silicon plug contact. The present invention also provides a method for fabricating an extended silicon barrier layer and oxygen diffusion path around both the top surface and side wall of a poly silicon plug contact.

In general terms, the invention is for a wafer comprising a poly silicon plug passing through a CP-contact. The poly silicon plug is formed from a relatively heavily doped poly silicon layer and a relatively lightly doped poly silicon layer having top and side walls and passing through the relatively heavily doped poly silicon layer to extend beyond the relatively heavily doped poly silicon layer towards a surface of the wafer. A barrier layer covers the top and side walls of the relatively lightly doped poly silicon layer for reducing oxidation at the surface of the poly silicon plug.

The invention also includes the method for fabricating the wafer which in general terms includes the steps of depositing a relatively heavily doped poly silicon layer in a CP-contact; depositing a relatively lightly doped poly silicon layer having top and side walls to pass through the relatively heavily doped poly silicon layer; and depositing a barrier layer to cover the top and side walls of the relatively lightly doped poly silicon layer to reduce oxidation at the surface of the poly silicon plug.

BRIEF DESCRIPTION OF THE FIGURES

Further preferred features of the invention will now be described for the sake of example only with reference to the following figures, in which:

FIGS. 3(*a*) and (*b*) are diagrammatic vertical cross-sectional views illustrating a poly CMP step in wafers of the prior art and of the present invention, respectively.

FIG. 4(*a*) is the same as FIG. 3(*a*) but has been redrawn beside FIG. 4(*b*) for ease of comparison. FIG. 4(*a*) illustrates a selective RIE-etch step in a wafer of the present invention.

FIG. 7(*a*) is a diagrammatic vertical cross-sectional view of a prior-art contact and barrier layer.

FIG. 7(*b*) is a diagrammatic vertical cross-sectional view of the present invention after processing according to the method of the present invention.

FIG. 8 shows the steps for fabricating the extended silicon barrier layer around both the top surface and side wall of a poly silicon plug contact of FIG. 7(*b*).

DETAILED DESCRIPTION OF THE EMBODIMENTS

Figure 1B:
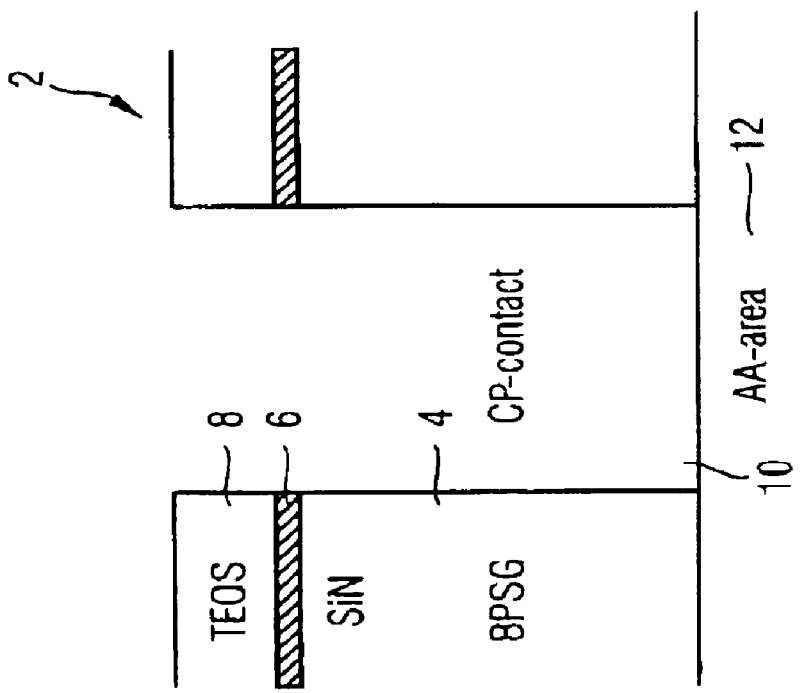
FIGS. 1(*a*) and (*b*) are diagrammatic vertical cross-sectional views of post CP-etch wafers of the prior art and of the present invention, respectively, serving as the starting points of the processes.

In FIGS. 1–7, for comparative purposes, steps of a prior art process and the process of the present invention are shown side by side for each of the fabrication steps.

First turning to FIG. 7(*b*), a silicon diffusion barrier 34, such as CoSi, TiSi or AlTiN, is formed on both the side wall and top of a poly silicon plug 15 formed from layers 16, 18. Here, the barrier can be discontinuous barriers described as a barrier and an additional barrier, for example. The plug is recessed and a heavily doped poly silicon layer 18 is deeply etched to prevent the inter diffusion of silicon of the poly silicon plug 15 with a metal layer 46 above the plug through the edge of the plug 44.

Figure 1A:
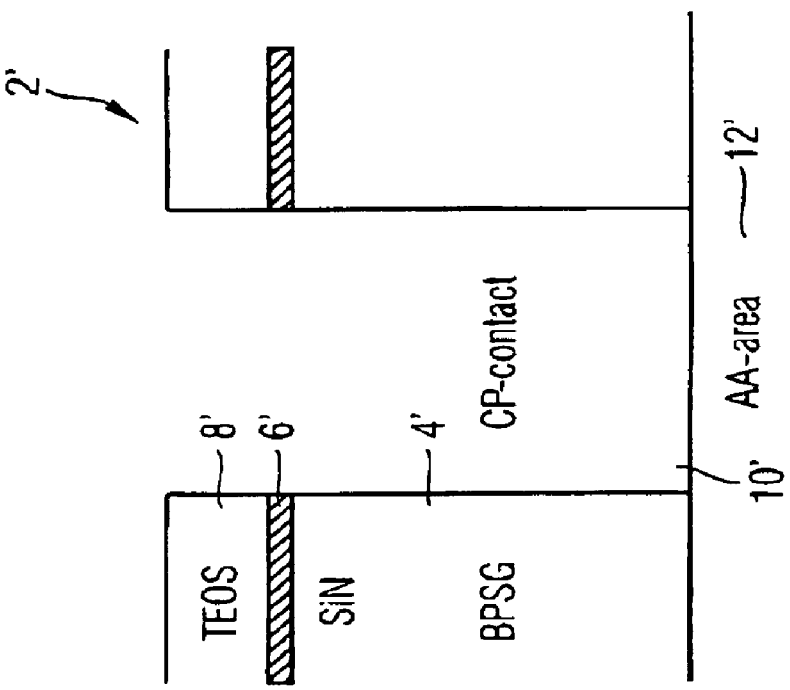

FIGS. 1(*a*) and (*b*) are diagrammatic vertical cross-sectional views of a post CP-etch (Contact Plug etch) (step 101 in FIG. 8) prior art wafer 2' and a post CP-etch wafer 2 of the present invention, serving as the starting points for the diffusion-barrier forming processes. In the prior-art illustration of FIG. 1(*a*), covering a BPSG (boro-phospho-silicate glass) layer 4' is a nitride layer (SiN layer) 6' and a TEOS (Tetraethyl Orthosilicate) layer 8'. The BPSG layer 4' is formed on an AA-area (Active Area) layer 12'. BPSG is commonly used to planarize surfaces and flows at low temperatures. TEOS is often used in CVD (chemical vapor deposition) SiO2 processes. A CP-contact passes through the layer 4', the SiN layer 6' and the TEOS layer 8'.

A wafer 2 of FIG. 1(*b*) is the same as that of FIG. 1(*a*) since the same starting point is illustrated. In the illustration of FIG. 1(*b*), the post CP-etch wafer 2 of the present invention includes a SiN layer 6 and a TEOS layer 8 covering a BPSG layer 4. The BPSG layer 4 is formed on an AA-area layer 12, with a diffusion stop layer underneath (not shown). A CP-contact 10 passes through the layer 4, the SiN layer 6 and the TEOS layer 8.

Figure 2B:
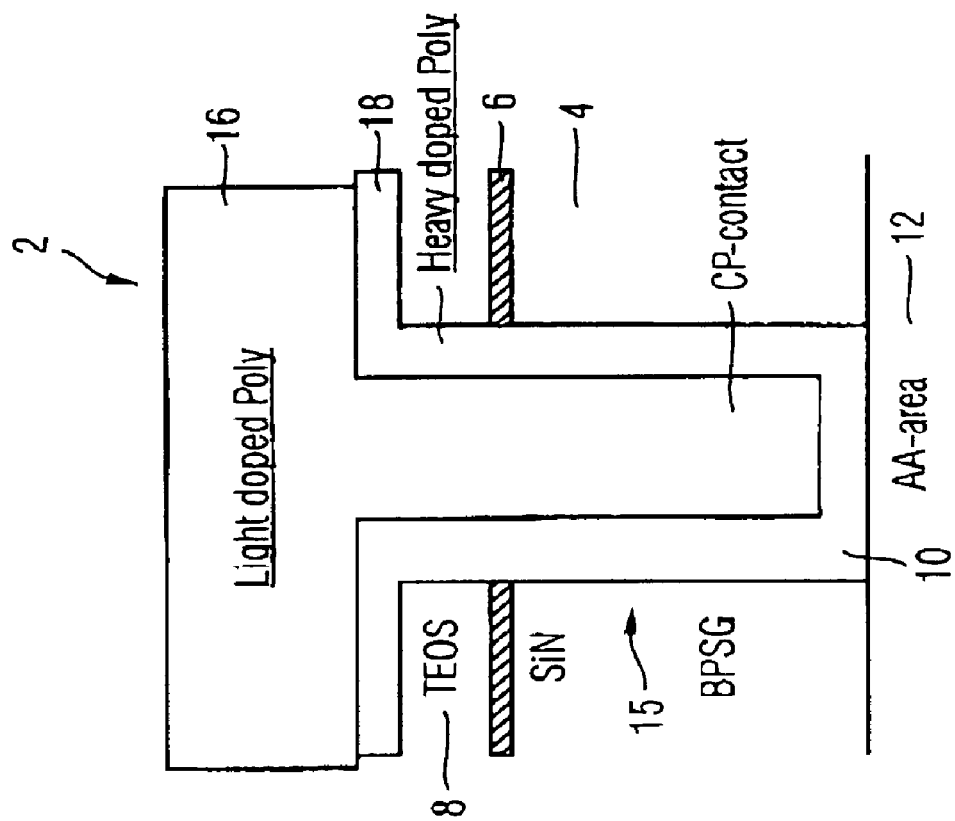
FIGS. 2(*a*) and (*b*) are diagrammatic vertical cross-sectional views illustrating a poly silicon deposition step in wafers of the prior art and of the present invention, respectively.
Figure 2A:
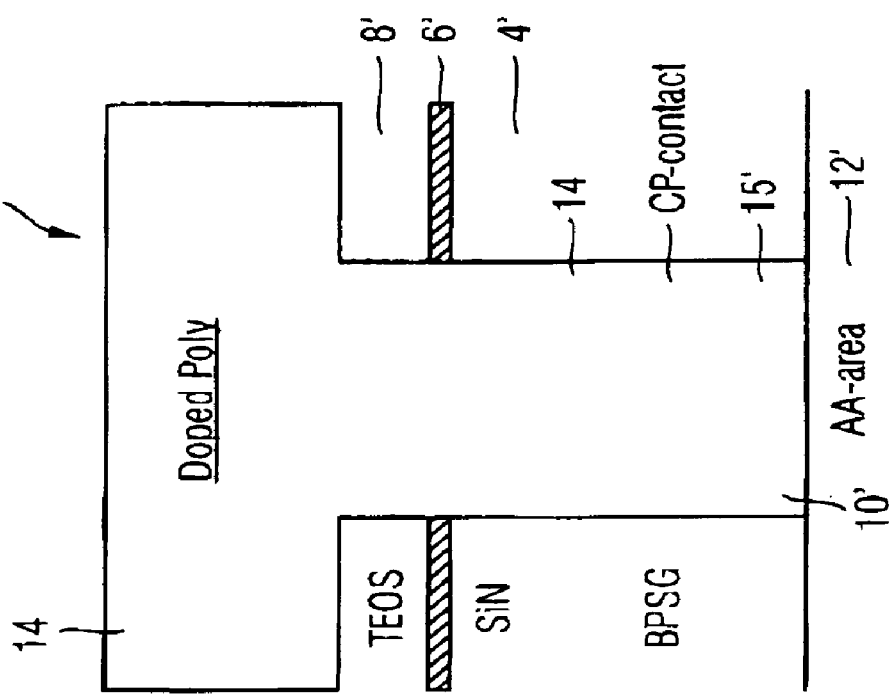

Following the CP-etch step 101, a poly silicon deposition step 103 (see FIG. 8) is performed. FIGS. 2(*a*) and (*b*) illustrate the prior art wafer 2' and the wafer 2 of the present invention, respectively, following the poly silicon deposition step. In the prior-art, doped poly silicon 14 having a relatively constant doping level is used to form a poly silicon plug 15'. However, in the present invention, two different poly silicon layers are used to form a poly silicon plug 15. A relatively more heavily doped poly silicon layer 18 is first deposited, covering the TEOS layer 8 and partially filling the CP-contact 10. Next, a relatively more lightly doped poly silicon layer 16 is deposited over the heavily doped poly silicon layer 18 and the TEOs layer 8 to fill the remainder of the CP-contact 10. Thus, in the present invention, differentially doped poly silicon layers are used.

Rather than using poly silicon as the differentially doped layers, other differentially doped conductive materials can be used to produce the side-wall barrier structure of the present invention.

Following the poly silicon deposition step 103, a poly silicon CMP (Chemical Mechanical Polishing) step 105 (see FIG. 8) is performed. FIGS. 3(a) and (b) illustrate the wafers 2' and 2 following the poly silicon CMP step. The poly silicon layers 14, 16, 18 are removed from the outer surfaces of the TEOS layers 8, 8'. There is approximately a 70 nm loss of the TEOS layers 8 and 8' due to over polish. After polishing, substantially planar surfaces 20, 22 remain on the wafers 2' and 2, respectively. Alternately, the poly silicon layers 16, 18 can be removed from the outer surface of the TEOS layer 8 using RIE (Reactive Ion Etching) combined with the step 107 of FIG. 8 as illustrated in FIG. 4(b).

Following the poly silicon CMP step 105, a selective RIE-etch step 107 (see FIG. 8) is performed. FIG. 4(b) illustrates the wafer 2 of the present invention, following the selective RIE-etch step. The etch is selective so as to etch the heavily doped poly silicon layer 18 more than the lightly doped poly silicon layer 16. Thus, the lightly doped poly silicon layer 16 extends generally axially along the CP-contact 10 and extends from the heavily doped poly silicon layer 18. The lightly doped poly silicon layer 16 extends closer to the plane of the surface 22 than does the heavily doped poly silicon layer 18. The heavily doped poly silicon layer 18 should be etched away to below the SiN layer 6. For example, the heavily doped poly silicon layer 18 can be etched away to 250 nm below the surface 22 as shown by the arrow 23 while the lightly doped poly silicon layer 16 can be etched away to 50 nm below the surface 22 as shown by the arrow 25. As mentioned above, this selective RIE-etch step can also achieve, either alone or in combination with poly CMP, the removal of the poly silicon layers 16, 18 from the outer surfaces of the TEOS layers 8, 8' as illustrated in FIG. 3(b).

Figure 4B:
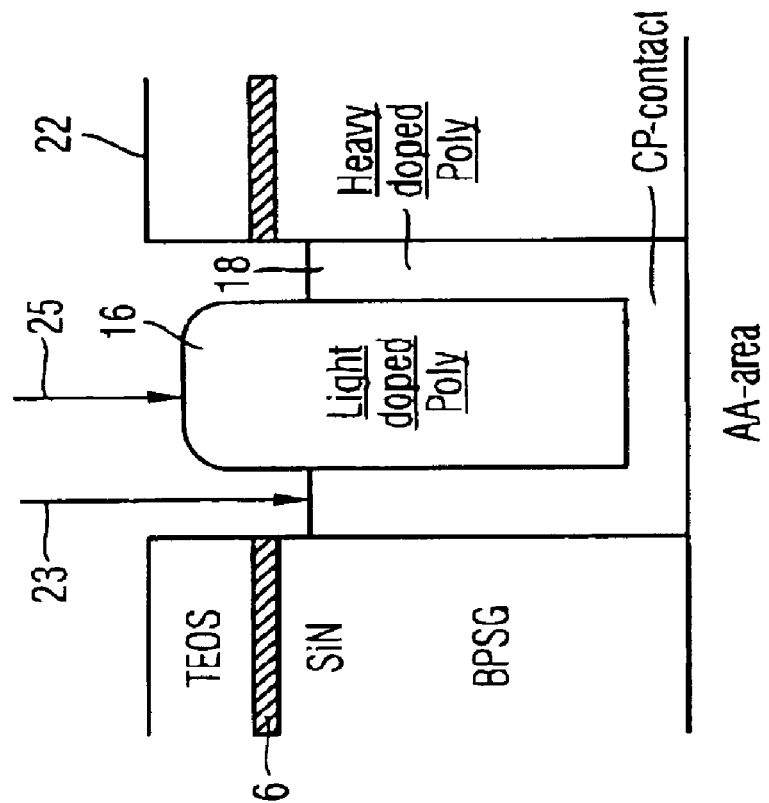
FIGS. 4(*a*) and (*b*) are diagrammatic vertical cross-sectional views of the wafers of the prior-art and present invention, respectively.
Figure 4A:
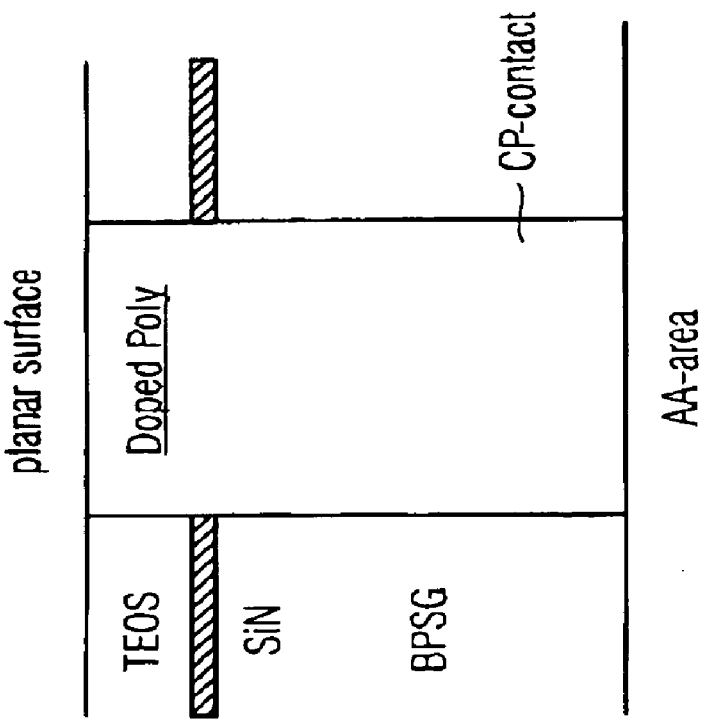

FIG. 4(a) is the same as FIG. 3(a) but has been redrawn beside FIG. 4(b) for ease of comparison.

Figure 5B:
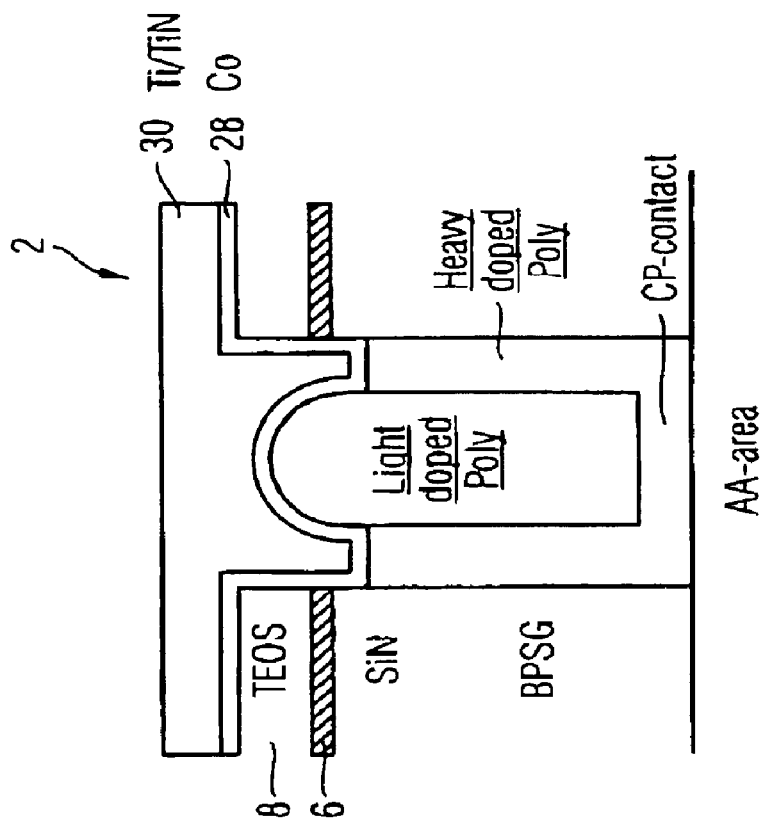
FIGS. 5(*a*) and (*b*) are diagrammatic vertical cross-sectional views illustrating the sputter of metal and the first RTA process step in wafers of the prior art and of the present invention, respectively.
Figure 5A:
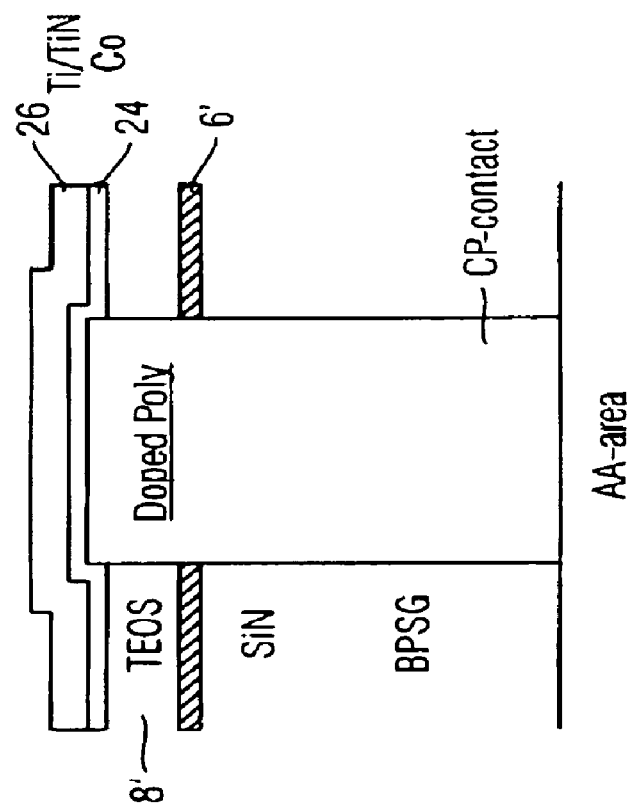

Following the RIE-etch step 107, a sputtering step 109 (see FIG. 8) is performed. FIGS. 5(a) and (b) illustrate the wafers 2' and 2 following the sputtering step. Layers of Co 24, 28 and Ti/TiN 26, 30 are sputtered first and then annealed with an RTA (rapid thermal annealing) process to form Salicide. Alternatively, layers of Ti/TiN can be used without the Co layers 24, 28.

Figure 6B:
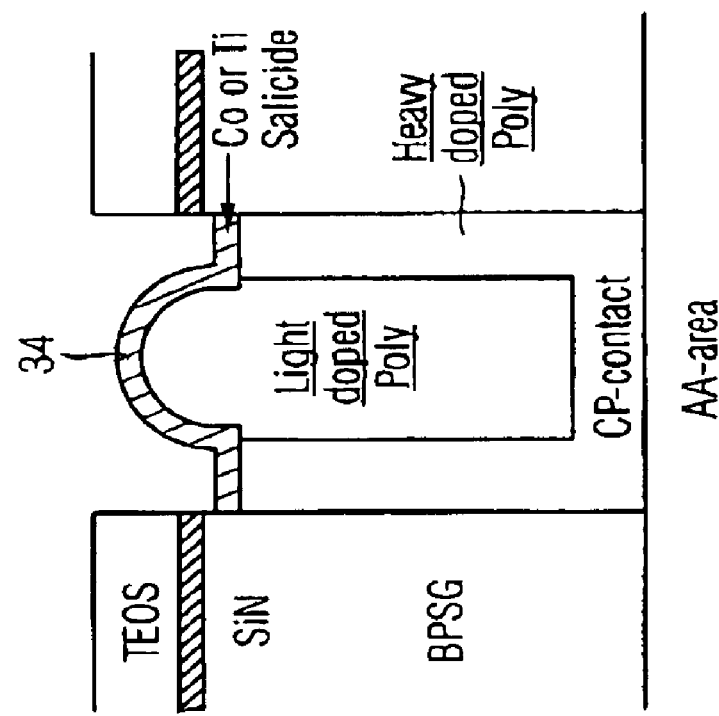
FIGS. 6(*a*) and (*b*) are diagrammatic vertical cross-sectional views illustrating removal of excessive metal and a second RTA process step in wafers of the prior art and of the present invention, respectively.
Figure 6A:
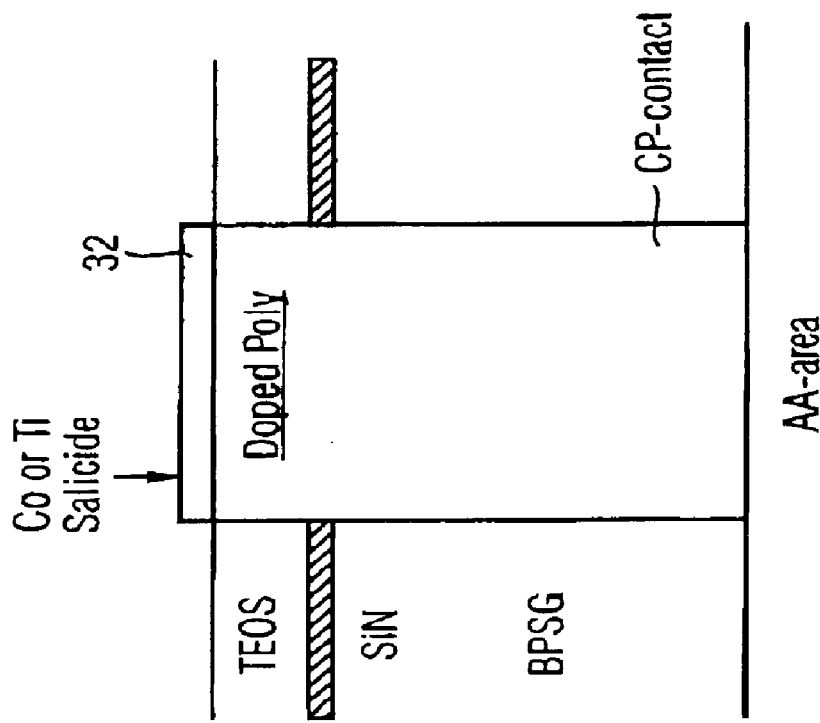

Following the sputtering and RTA step 109, excess metal is removed and a second RTA step 111 (see FIG. 8) is performed. FIGS. 6(a) and (b) show the wafers 2' and 2 following the second RTA for Salicide formation process in which layers of Co or Ti Salicide silicon barrier layers 32 and 34, respectively, are left covering the doped poly silicon. The strip is not needed if other wet chemistry etchings of these metals is applied.

FIG. 7(a) shows the prior-art wafer following sputtering of the first layers of the silicon barrier. A thin layer of Ti 36 covers both the sides and top of the layer of Co or Ti Salicide 32. A layer of Ir 38 covers the layer of Ti 36. A bottom electrode (BE) 46' of a capacitor is shown above the layer of Ir 38. Pout BE-etch (bottom electrode etch), an $O_2$ path (indicated in FIG. 7(a) by the arrow 48) can form at the at the top edge 44' of the poly silicon plug between the layer of Ti 36, the layer of Salicide 32, and the doped poly silicon layer 14. Oxidation at the interface of the Salicide layer 32 and the doped poly silicon layer 14 (at the locations illustrated by the arrows 50 in FIG. 7(a)) can lead to open CP-contacts. This open contact means that there is inadequate electrical contact between the poly silicon layer 14 and the bottom electrode 46' of the capacitor. There is also a bump or step formed in the barrier layer (the Ti layer 36 and the Ir layer 38 which impedes further processing (e.g. the CW etch). A barrier is needed to prevent the diffusion of silicon from a contact plug to a capacitor and also to prevent the diffusion of oxygen from a capacitor to the contact plug. A diffusion path for silicon, allowing the diffusion of silicon from the poly silicon plug to the capacitor, is due to the discontinuous metal layer 46' above, caused by the step height after the barrier formation and due to the corner 44' between the poly silicon layer 14 and the Ti layer 36.

Following the second RTA step 111, sputtering of the first layers of the silicon barrier is performed at step 113 (see FIG. 8). Returning to FIG. 7(b) the wafer 2 is shown following sputtering of the first layers of the silicon barrier. A thin layer of Ti 40 covers the barrier layer of Co or Ti Salicide 34. A layer of Ir 42 covers the layer of Ti 40. Post BE-etch, an $O_2$ path can form at the edge 44 as shown by the arrow designated by 54. However, oxidation at the interface of the Co or Ti Salicide 34 and the layers of doped poly 16, 18 is brought down to an insignificant level (no open CP-contacts) in the present invention because it is sealed by the SiN layer 6 and because the diffusion path is too long. Additionally, unlike the wafer 2' of FIG. 7(a), there is no bump or step thereby making later processing more convenient. Also, unlike the prior art, the edges of the doped poly 16, 18 are separated by the Salicide layer 34 from the edges of the layer of Ti 40, thereby eliminating the diffusion path for silicon. Thus there is no diffusion of silicon from the poly silicon plug to the capacitor.

After step 113 of FIG. 8, standard processing in continued at step 115 of FIG. 8 to complete capacitor and interconnections above the Ir layer 42.

Some of the advantages of the present invention can be described as follows. If the steps are performed with a planarization etch, no additional work is required for manufacturing. Silicon diffusion alloy is suppressed at the doped poly silicon layer 18 step corner. The interface of the Ti layer 40 to the Salicide layer 34 is recessed below the level of the SiN 6 layer thereby providing good sealing against oxidation. Even if some oxygen can pass by the seal between the Ti layer 40 and the SiN layer 6, the diffusion path at the interface is very long before interrupting the electrical contact between the plug and the capacitor. Also, there is no bump formed and therefore no spacer-effects are created during the later processing of thick layers.

Although the invention has been described above using particular embodiments, many variations are possible within the scope of the claims, as will be clear to a skilled reader.

We claim:

1. A wafer comprising:

a contact having a conductive filling passing through it;

a relatively heavily doped conductive layer forming a portion of the conductive filling;

a relatively lightly doped conductive layer having top and side walls forming another portion of the conductive filling and passing through the relatively heavily doped conductive layer to extend beyond the relatively heavily doped conductive layer towards a surface of the wafer; and a barrier layer covering the top and side walls of the relatively lightly doped conductive layer for reducing oxidation at the surface of the conductive filling.

2. The wafer of claim 1 wherein the contact is a CP-contact and the conductive filling is poly silicon forming a poly silicon plug.

3. The wafer of claim 2, further comprising an additional barrier layer covering a top wall of the relatively heavily doped poly silicon layer such that the barrier layer and additional barrier layer extend to opposite sides of a surface formed by a nitride layer through which the CP-contact passes.

4. The wafer of claim 2, wherein the poly silicon plug passes through a nitride layer sealed for reducing diffusion of material forming the poly silicon plug into an metal electrode by reducing an oxidation path between the metal electrode and the poly silicon plug.

5. The wafer of claim 4, wherein the nitride layer is SiN.

6. The wafer of claim 2, wherein the relatively lightly doped poly silicon layer extends beyond the relatively heavily doped poly silicon layer as a result of a selective RIE-etch.

7. The wafer of claim 2, wherein the barrier layer comprises CoSi, TiSi or AlTiN.

8. The wafer of claim 2, further comprising a metallic layer affixed to the poly silicon plug at a position below the nitride layer.

9. The wafer of claim 2, further comprising a Salicide layer separating the poly silicon plug from the metallic layer and substantially preventing diffusion of silicon from the poly silicon plug to the metallic layer.

10. The wafer of claim 2, wherein the wafer has a substantially planar surface above the poly silicon plug.

11. A method for fabricating a wafer comprising the steps of:

depositing a relatively heavily doped conductive layer in a contact;

depositing a relatively lightly doped conductive layer having top and side walls to pass through the relatively heavily doped conductive layer; and depositing a barrier layer to cover the top and side walls of the relatively lightly doped poly silicon layer to reduce oxidation at the surface of the conductive plug.

12. The method of claim 11 wherein the conductive layer is a poly silicon layer and the contact is a CP-contact.

13. The method of claim 12, further comprising the step of selectively etching the relatively lightly doped poly silicon layer and the relatively heavily doped poly silicon layer so that the relatively lightly doped poly silicon layer extends beyond the relatively heavily doped poly silicon layer.

14. The method of claim 12, further comprising the steps of;

depositing a diffusion barrier layer over the poly silicon layers such that the diffusion barrier layer is sealed to a nitride layer through which the CP-contact passes.

15. The method of claim 11 wherein the contact is a CP-contact and the conductive filling is poly silicon forming a poly silicon plug.

* * * * *